United States Patent
Rozen (10) Patent No.: US 11,569,444 B2
(45) Date of Patent: Jan. 31, 2023

(54) THREE-DIMENSIONAL CONFINED MEMORY CELL WITH DECOUPLED READ-WRITE

(71) Applicant: INTERNATIONAL BUSINESS MACHINES CORPORATION, Armonk, NY (US)

(72) Inventor: John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/217,788

(22) Filed: Mar. 30, 2021

(65) Prior Publication Data
US 2022/0320426 A1   Oct. 6, 2022

(51) Int. Cl.
*G11C 13/00* (2006.01)
*H01L 45/00* (2006.01)
*H01L 27/24* (2006.01)
*G11C 11/56* (2006.01)

(52) U.S. Cl.
CPC ...... *H01L 45/1253* (2013.01); *G11C 11/5685* (2013.01); *G11C 13/004* (2013.01); *G11C 13/0007* (2013.01); *G11C 13/0069* (2013.01); *H01L 27/2481* (2013.01); *H01L 45/146* (2013.01)

(58) Field of Classification Search
CPC ............ G11C 11/5614; G11C 13/0011; G11C 13/004; G11C 13/0069; G11C 2013/005; G11C 2013/0071; H01L 45/085; H01L 45/146

USPC ................................................... 365/148, 153
See application file for complete search history.

(56) References Cited

U.S. PATENT DOCUMENTS

| | | | |
|---|---|---|---|
| 7,989,902 B2 | 8/2011 | Ando | |
| 9,224,946 B2 | 12/2015 | Kim | |
| 9,601,692 B1 * | 3/2017 | Jo | ....... G11C 13/0097 |
| 9,887,351 B1 | 2/2018 | Ando | |
| 10,079,341 B1 | 9/2018 | Bedell | |
| 10,090,461 B2 | 10/2018 | Karpov | |
| 10,186,657 B2 | 1/2019 | Brew | |
| 10,366,323 B2 | 7/2019 | Ando | |
| 10,429,343 B1 * | 10/2019 | Talin | ............ H01L 45/1266 |
| 10,497,866 B1 | 12/2019 | Fuller | |

(Continued)

FOREIGN PATENT DOCUMENTS

WO   WO-2021216842 A1 * 10/2021 ......... G11C 13/0007

OTHER PUBLICATIONS

Chen, et al., "A CMOS-compatible electronic synapse device based on Cu/SiO2/W programmable metallization cells," Nanotechnology 27 255202, 2016, 10 pages, vol. 27, No. 25, IO Publishing Ltd., UK, DOI: 10.1088/0957-4484/27/25/255202, Retrieved from the Internet: <URL: https://iopscience.iop.org/article/10.1088/0957-4484/27/25/255202>.

(Continued)

*Primary Examiner* — Michael T Tran
(74) *Attorney, Agent, or Firm* — L. Jeffrey Kelly (57) ABSTRACT

An embodiment of the invention may include a first electrode, a second electrode, and a multi-level nonvolatile electrochemical cell located between the first electrode and second electrode. The multi-level nonvolatile electrochemical cell may have a read path and a write path through the cell, where the read path and the write path are different.

18 Claims, 5 Drawing Sheets

(56) References Cited

U.S. PATENT DOCUMENTS

| | | | |
|---|---|---|---|
| 10,586,591 B2 | 3/2020 | Li | |
| 10,748,059 B2 | 8/2020 | Copel | |
| 10,810,506 B1* | 10/2020 | Zota | H03K 3/38 |
| 2004/0064660 A1* | 4/2004 | Lyons | G06F 13/4243 |
| | | | 711/167 |
| 2005/0243596 A1* | 11/2005 | Symanczyk | H01L 45/143 |
| | | | 257/E45.002 |
| 2009/0207645 A1* | 8/2009 | Parkinson | G11C 13/0011 |
| | | | 365/158 |
| 2009/0231907 A1* | 9/2009 | Bloch | G11C 13/02 |
| | | | 365/153 |
| 2009/0289240 A1* | 11/2009 | Wang | H01L 45/1658 |
| | | | 257/E45.002 |
| 2010/0123542 A1* | 5/2010 | Vaithyanathan | H01L 45/124 |
| | | | 338/20 |
| 2011/0272664 A1* | 11/2011 | Tada | H01L 45/1253 |
| | | | 257/4 |
| 2012/0097916 A1* | 4/2012 | Tada | H01L 45/1625 |
| | | | 257/4 |
| 2012/0275211 A1* | 11/2012 | Yi | G11C 13/0023 |
| | | | 365/148 |
| 2012/0319072 A1* | 12/2012 | Wei | H01L 27/249 |
| | | | 257/E47.001 |
| 2013/0140648 A1* | 6/2013 | Hasegawa | G11C 14/00 |
| | | | 257/411 |
| 2015/0024298 A1* | 1/2015 | Blanchet | H01M 8/04902 |
| | | | 429/432 |
| 2015/0162081 A1* | 6/2015 | Molas | G11C 7/1078 |
| | | | 711/105 |
| 2015/0340606 A1* | 11/2015 | Tada | H01L 45/1683 |
| | | | 257/4 |
| 2017/0365641 A1 | 12/2017 | Bedau | |
| 2018/0166197 A1* | 6/2018 | Wang | H01L 43/10 |
| 2018/0197917 A1 | 7/2018 | Ando | |
| 2018/0219155 A1 | 8/2018 | Ando | |
| 2019/0245543 A1* | 8/2019 | Lee | G11C 13/004 |
| 2019/0378004 A1 | 12/2019 | Todorov | |
| 2020/0066797 A1 | 2/2020 | Kong | |
| 2020/0066968 A1* | 2/2020 | Park | H01L 43/12 |
| 2020/0075860 A1 | 3/2020 | Ando | |
| 2020/0227635 A1* | 7/2020 | Yang | H01L 45/146 |
| 2020/0243762 A1* | 7/2020 | Wagner | H01L 45/142 |
| 2020/0273911 A1* | 8/2020 | Tang | H01L 45/146 |
| 2020/0286536 A1* | 9/2020 | Fukami | H01L 27/228 |
| 2021/0066394 A1* | 3/2021 | Conti | H01L 23/5226 |

OTHER PUBLICATIONS

Fuller, et al., "Parallel programming of an ionic floating-gate memory array for scalable neuromorphic computing," Science, May 10, 2019, 5 pages, vol. 364, Issue 6440, DOI: 10.1126/science. aaw5581, Retrieved from the Internet: <URL: https://science.sciencemag.org/content/364/6440/570/tab-pdf>.

Gokmen, et al., "Acceleration of Deep Neural Network Training with Resistive Cross-Point Devices: Design Considerations," Frontiers in Neuroscience, Jul. 21, 2016, 13 pages, vol. 10, Art. 333, DOI: 10.3389/fnins.2016.00333, Retrieved from the Internet: <URL: https://www.frontiersin.org/articles/10.3389/fnins.2016.00333/full>.

Kim, et al., "Metal-oxide based, CMOS-compatible ECRAM for Deep Learning Accelerator," 2019 IEEE International Electron Devices Meeting (IEDM), Dec. 7-11, 2019 [accessed on Jan. 4, 2021], 4 pages, IEEE, DOI: 10.1109/IEDM19573.2019.8993463, Retrieved from the Internet: <URL: https://ieeexplore.ieee.org/document/8993463>.

Lee, et al., "Two-Terminal Structured Synaptic Device Using Ionic Electrochemical Reaction Mechanism for Neuromorphic System," IEEE Electron Device Letters, Apr. 2019 [accessed on Oct. 2, 2020], vol. 40, No. 4, pp. 546-549.

Li, et al., "Low-Voltage, CMOS-Free Synaptic Memory Based on $LixTiO2$ Redox Transistors," ACS Applied Materials & Interfaces, 2019 [accessed on Oct. 2, 2020], vol. 11, No. 42, pp. 38982-38992, ACS Publications, Retrieved from the Internet: <URL: https://pubs.acs.org/doi/10.1021/acsami.9b14338>.

Rozen, et al., "Metal-Oxide-Based Neuromorphic Device," Application and Drawings, Filed on Jul. 17, 2019, 51 Pages, U.S. Appl. No. 16/513,871.

Tang, et al., "ECRAM as Scalable Synaptic Cell for High-Speed, Low-Power Neuromorphic Computing," 2018 IEEE International Electron Devices Meeting (IEDM), Dec. 1-5, 2018 [accessed on Jan. 4, 2021], 4 pages, IEEE, San Francisco, CA, USA, DOI: 10.1109/IEDM.2018.8614551, Retrieved from the Internet: <URL: https://ieeexplore.ieee.org/abstract/document/8614551>.

Van de Burgt, et al., "Organic electronics for neuromorphic computing," Nature Electronics 1, Jul. 13, 2018 [accessed on Jan. 4, 2021], 18 pages, Retrieved from the Internet: <URL: https://www.nature.com/articles/s41928-018-0103-3>.

IBM: List of IBM Patents or Patent Applications Treated as Related (Appendix P), Mar. 30, 2021, 2 pages.

Rozen, et al., et al., "Two-Terminal Non-Volatile Memory Cell for Decoupled Read and Write Operations," Application and Drawings, Filed on Mar. 30, 2021, 29 Pages, Related U.S. Appl. No. 17/217,767.

* cited by examiner

FIG. 10

THREE-DIMENSIONAL CONFINED MEMORY CELL WITH DECOUPLED READ-WRITE

BACKGROUND

The present invention relates to memory devices, and more specifically, to resistive analog memory devices.

Technical problems such as character recognition and image recognition by a computer are known to be well handled by machine-learning techniques. "Machine learning" is used to broadly describe a primary function of electronic systems that learn from data. In machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANNs can include deep neural networks (DNNs), convolutional neural networks (CNNs), and other types of neural networks. Crossbar arrays are high density, low cost circuit architectures used to form a variety of electronic circuits and devices, including ANN architectures, neuromorphic microchips and ultra-high density non-volatile memory. A basic crossbar array configuration includes a set of conductive row wires and a set of conductive column wires formed to intersect the set of conductive row wires. The intersections between the two sets of wires are separated by so-called cross-point devices. Such cross-point devices may be analog memory devices capable of storing a weighted value (e.g., 0-1 instead of the binary 0 or 1), and may be capable of use in analog computing devices.

Cross-point devices can be implemented as so-called resistive memory (colloquially, memristive) devices. Characteristics of a memristive device may include non-volatility, the ability to store a variable analog resistance value, the ability to determine the analog resistance value without disturbing the state of the memristive device, and the ability to tune up or tune down a resistance using current or voltage pulses. These memristive devices can be used in hardware to simulate the artificial synapses of an ANN.

BRIEF SUMMARY

An embodiment of the invention may include a memory structure. The structure may include a multi-level nonvolatile electrochemical cell having an inner conductive core surrounded by a programming gate. The inner conductive core may be in contact with a first contact. The outer portion of the cell may comprise a channel. The channel may be in contact with a second contact.

An embodiment of the invention may include a first electrode, a second electrode, and a multi-level nonvolatile electrochemical cell located between the first electrode and second electrode. The multi-level nonvolatile electrochemical cell may have a read path and a write path through the cell, where the read path and the write path are different.

An embodiment of the invention may include a method of writing to the memory structure. The method may include creating a voltage between the first contact and the second contact. The voltage may cause electrons to move through a variable resistance channel of the multi-level nonvolatile electrochemical cell. The voltage may create an electric field across a charge-exchange layer, which may cause ions to move along the electric field. The method may include the direction of ion movement being different than the direction of electron movement.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Analog resistive memory devices may use mechanisms of ion transfer during write operations to impact the resistance of the overall memory device during read operations. Such devices may enable migration of conductive ions into a dielectric region, thereby increasing the conductivity through the dielectric, or alternatively may enable migration of ions containing holes into a conductive region, thereby reducing the conductivity of the conductive region. However, read and write paths of these devices overlap, leading to breakdown of the dielectric. By decoupling the read path and write path during operations, such breakdown may be reduced, as the flow of current through the devices is not required to move through a dielectric layer of the device.

However, decoupling of read and write paths would typically require additional wiring to the device, as well as additional transistors to signal the device, thereby increasing the footprint of structures needed to operate the device. By providing separate paths in the memory cell for read and write paths, while maintaining a common electrodes for the memory cell for the read and write paths, the footprint of the structures may be reduced, while maintaining decoupled read and write paths for the resistive analog memory device.

Figure 1:
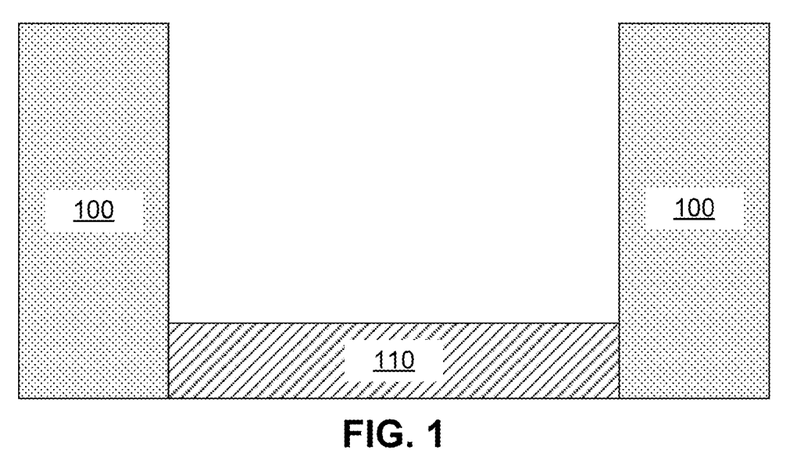
FIG. 1 depicts a cross-sectional view of a bottom contact located in an insulating layer, according to an example embodiment.

Referring to FIG. 1, a cross-sectional view of the bottom electrode 110 and the conductive pedestal 115 located in the $M_x$ dielectric 100 is depicted. The $M_x$ dielectric 100 may be formed on a sub structure (not shown) and may be formed using any suitable dielectric deposition techniques. The $M_x$ dielectric 100 may be silicon nitride, silicon oxide, silicon oxynitride, or any other suitable low-k dielectrics. The deposited dielectric can be etched to form the regions that contain the bottom electrode 110 any appropriate lithographic process. The bottom electrode 110 can be formed from metal or a metal nitride. In one or more embodiments of the present invention the sense electrodes are made using titanium at a thickness of about 5 nm or platinum at a thickness of about 50 nm, but it should be understood that any appropriate material and thickness can be used, including for example tungsten, nickel, molybdenum, tantalum, copper, silver, gold, ruthenium, iridium, rhenium, rhodium, and alloys thereof. In one or more embodiments of the present invention the bottom electrode 110 can be formed by an appropriate physical vapor deposition (PVD) process, whereby a sputtering apparatus can include electron-beam evaporation, thermal evaporation, direct-current diode systems, radio frequency sputtering, magnetron sputtering, or ionized metal plasma sputtering. Following deposition of the material for the bottom electrode 110 and the conductive pedestal 115, chemical mechanical polishing (CMP) may remove any material above the $M_x$ dielectric 100, forming a substantially planar surface between the $M_x$ dielectric 100, the bottom electrode 110.

Figure 2:
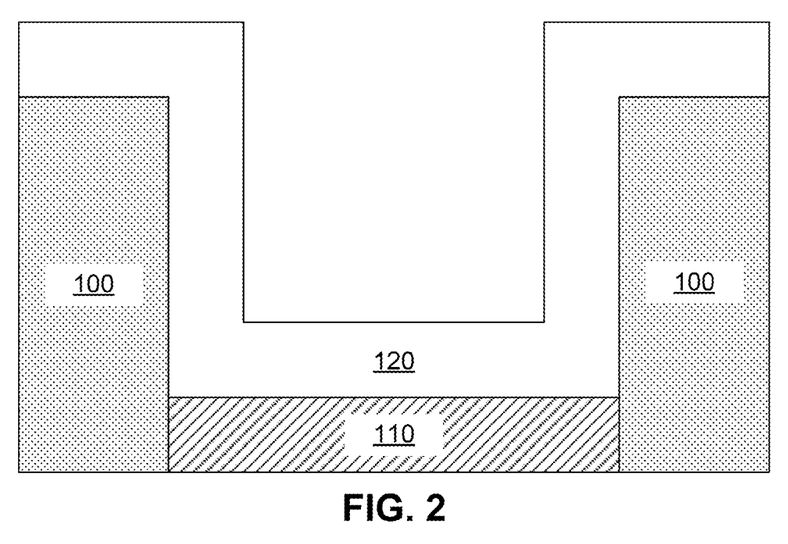
FIG. 2 depicts a cross-sectional view following deposition of a channel material layer; according to an example embodiment.

Referring to FIG. 2, formation of a channel material layer 120 is depicted. In one or more embodiments of the present invention the channel material layer 120 is formed from a variable-resistance material that changes resistance based on its oxygen content and is composed of metal-oxides such as WOx, TiOx, VOx, TaOx, HfOx. For example, the variable-resistance material can be WO3, TiO2, HfO2, Ta2O5, VxOy, and their sub-oxides. The channel material layer 120 can be formed by any appropriate deposition process such as, for example, PVD, ALD, and CVD. For example, a metal-oxide layer about 50 nm thick can be formed by sputtering, or a layer of about 40 nm thick can be formed by electron beam evaporation. The channel can be made 1-50 nm in thickness in some examples.

Figure 3:
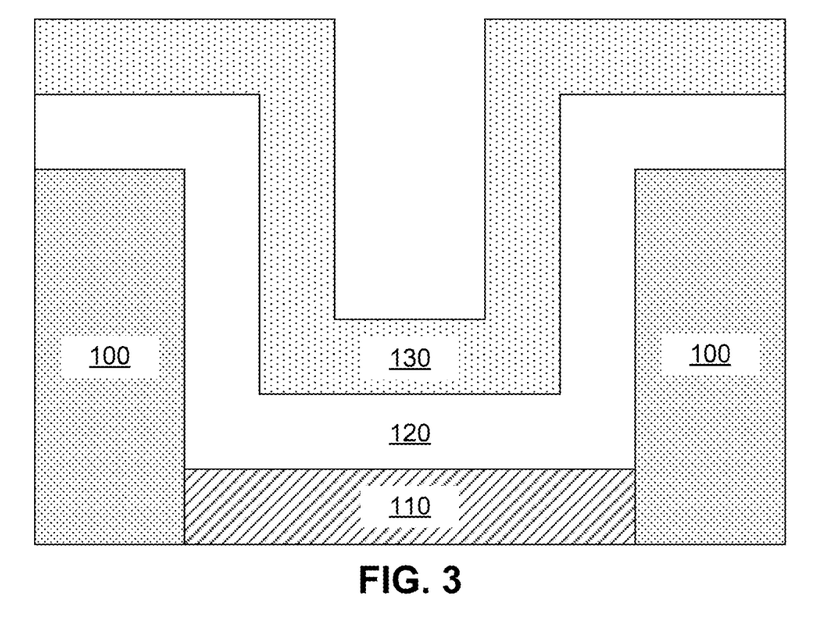
FIG. 3 depicts a cross-sectional view following deposition of a ion exchange layer; according to an example embodiment.

Referring to FIG. 3, formation of an ion exchange material layer 130 is depicted, and optionally a metal-oxide reservoir layer may be formed with the ion exchange material layer. The ion exchange material layer 130 may be formed on the channel material layer 120. The ion exchange material layer 130 may be formed using a dielectric material composed of a metal-oxide such as HfOx or TaOx in their sub-oxide or stoichiometric form, for example, $HfO_2$, $Ta_2O_5$, and their sub-oxides. The ion exchange material layer 130 can be of a thickness between 1-50 nm. The ion exchange material layer 130 can be formed using chemical vapor deposition (CVD), PVD, or atomic layer deposition (ALD).

The optional metal-oxide reservoir layer that is formed from any appropriate oxygen-containing material where oxygen ions readily dissociate under an applied voltage. One exemplary material for the metal-oxide reservoir layer is cerium oxide ($CeO_2$), which reversibly converts to a non-stoichiometric oxide by emitting oxygen ions when subjected to an appropriate voltage. In one specific example, the metal-oxide reservoir layer can be formed from cerium oxide at a thickness of less than 100 nm by a thermal evaporation process. The thickness of the metal-oxide reservoir layer can be in a predetermined range. Other oxides capable of oxygen exchange such as but not limited to $WO_3$, $TiO_2$, $CuOx$, $Al_2O_3$, $Ta_2O_5$, $HfO_2$, or gaseous/atmospheric oxygen can be used for metal-oxide reservoir. The metal-oxide reservoir can also be formed using ALD, PVD, CVD, diffusion, or any other process. The metal-oxide reservoir can be a hydrogen reservoir in other examples and is composed of suitable material.

It should be noted that described herein are some possible carriers and effects yielding reversible tunability of the device, however, in other examples different techniques may be used. The charge exchange can include non-metallic ions (oxygen, hydrogen) modifying the resistivity of the channel material layer 120. The charge exchange, in one or more examples, can include electron/holes building up static charge in ion exchange material 125 and affecting carrier dynamic in the channel. For example, the channel material layer 120 accepts additional oxygen ions by intercalation, where the oxide material creates a crystalline structure and additional oxygen ions (e.g., $O^{2-}$) fit into gaps in that crystalline structure under an appropriate voltage. The voltage overcomes the repulsive force created by any electrical charge already present in the channel material layer 120, forcing more charged ions to occupy that layer.

Figure 4:
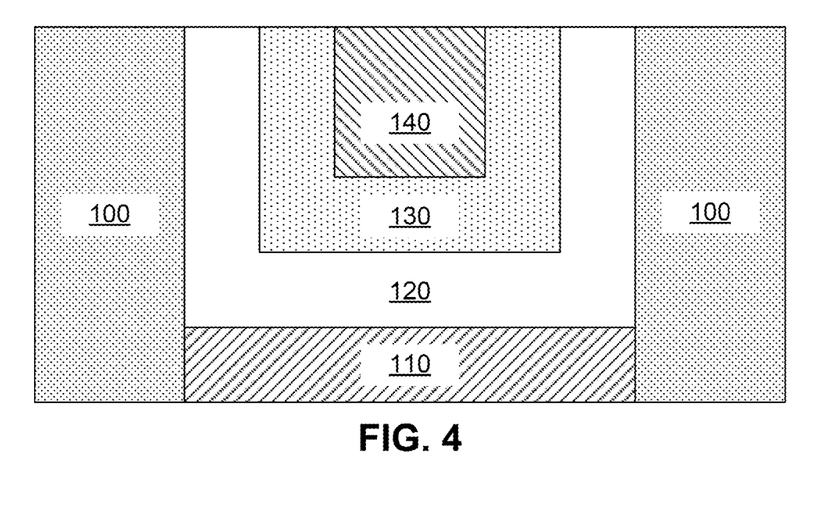
FIG. 4 depicts a cross-sectional view following deposition of a conductive core; according to an example embodiment.

Referring to FIG. 4, in one or more embodiments of the present invention an conductive core 140 is formed on the optional metal-oxide reservoir layer or ion exchange material layer 130. In one or more embodiments of the present invention it is specifically contemplated that the conductive core 140 can be formed from metal or a metal nitride. In one or more embodiments of the present invention the conductive core 140 are made using titanium or platinum, but it should be understood that any appropriate material and thickness can be used, including for example tungsten, nickel, molybdenum, tantalum, copper, silver, gold, ruthenium, iridium, rhenium, rhodium, and alloys thereof. In one or more embodiments of the present invention the conductive core 140 can be formed by an appropriate physical vapor deposition (PVD) process, whereby a sputtering apparatus can include electron-beam evaporation, thermal evaporation, direct-current diode systems, radio frequency sputtering, magnetron sputtering, or ionized metal plasma sputtering. Following the deposition of a material of the conductive core 140, chemical mechanical polishing (CMP) is performed to remove material above the surface of the $M_x$ dielectric 100 create channel 125 and ion exchange layer 135 (alternatively charge-exchange layer).

Figure 5:
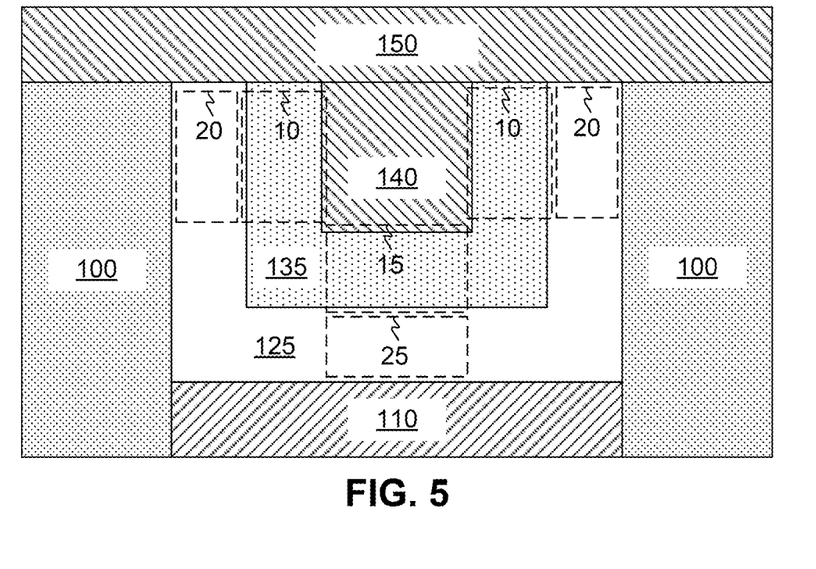
FIG. 5 depicts a cross-sectional view following deposition of a dielectric layer, according to an example embodiment.
Figure 6:
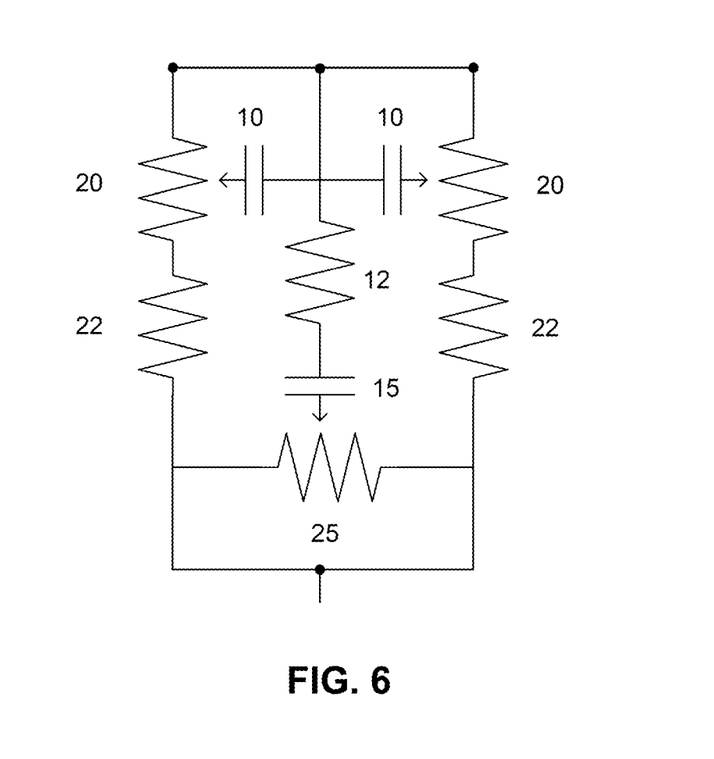
FIG. 6 depicts an electrical wiring diagram describing the operation of the memory cell, according to an example embodiment.

Referring to FIG. 5, wiring above the memory cell may be formed. An $M_{x+1}$ dielectric (not shown) may be formed and patterned to create a trench for the top electrode 150. The $M_{x+1}$ dielectric layer may be formed using any suitable dielectric deposition techniques. The $M_{x+1}$ dielectric may be silicon nitride, silicon oxide, silicon oxynitride, or any other suitable low-k dielectrics. The top electrode 150 may be formed within a $M_{x+1}$ dielectric layer (not shown), using similar materials and techniques as the formation of the bottom electrode 110 and the conductive pedestal 115 in the $M_x$ dielectric 100. The top electrode 150 may be part of a wordline. Additionally, as illustrated in FIG. 6 and overlaid onto FIG. 5, the structure may include a first programming gate 10, a first variable resistor 20, a fixed channel resistor 22, a fixed conductive core resistor 12, a second programming gate 15, and a second variable resistor 20. A programming gate 10 may be the portion of the ion exchange layer 135 capable of transferring ions into the channel 125, having an electrode that includes either conductive core 140. A variable resistor 20 may be a portion of the channel 125, and location of the variable resistor may be based on the location where ions may be transferred from the ion exchange layer 135. The tuning of the characteristics of the elements of the memory cell may be done through adjusting the thicknesses of the channel 125 and ion exchange layer 135.

Figure 7:
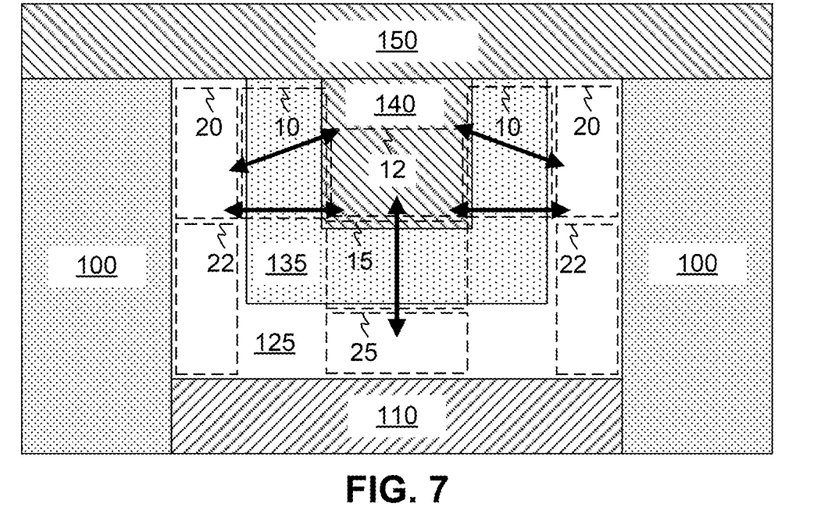
FIG. 7 depicts a movement of charged elements through the memory cell during a write operation, according to an example embodiment.
Figure 10:
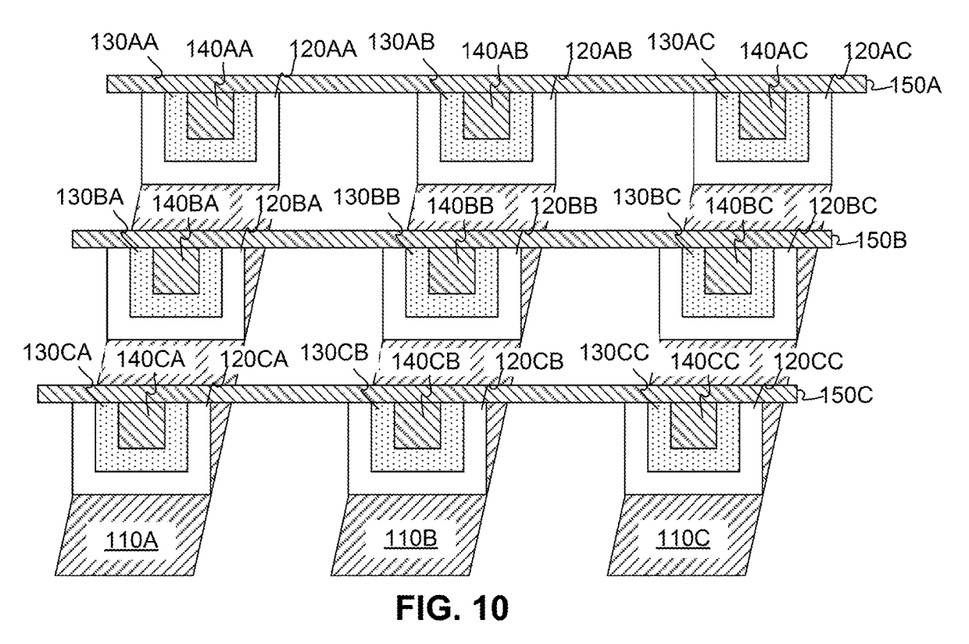
FIG. 10 depicts a plurality of memory cells arranged in a cross-point array, according to an example embodiment.

Referring to FIG. 7, a write operation is depicted. During this operation, first voltage is applied across the top electrode 150 and bottom electrode 110. The first voltage is selected so that a sufficient potential is created between the conductive core 140 and the channel 125, which may cause non-metal ions, for example oxygen ions, to migrate between the channel 125 and the ion exchange layer 135. For example, as first voltage may be about 1V to about 5V. Such migration of ions allows the memory device to produce a movement of ions that is not in the direction of current flow during a read operation. Additionally, because the top electrode 150 is in direct contact with the channel 125, current will flow between the top electrode 150 and bottom electrode 110 along the channel as well. It should be noted that the arrows depicted in FIG. 10 show the movement of ions from ion exchange layer 135, as well as the flow of current along channel 125.

Figure 8:
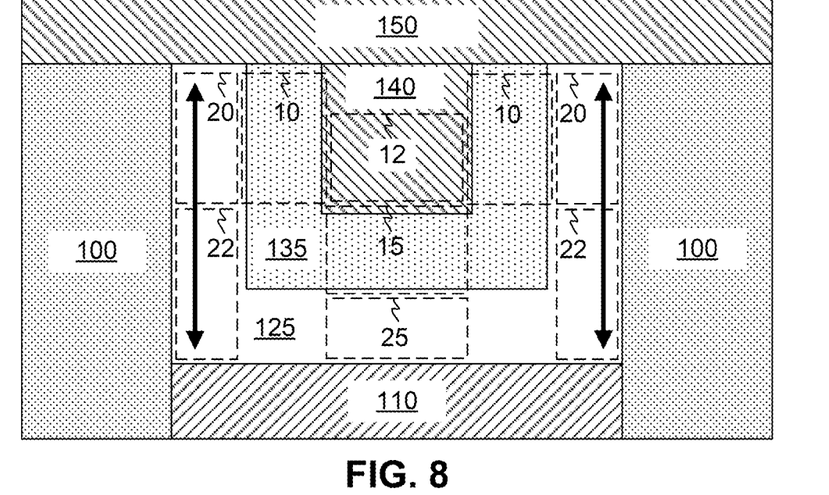
FIG. 8 depicts a movement of charged elements through the memory cell causing a read operation, according to an example embodiment.

Referring to FIG. 8, flow of current through the memory cell during a read operation is depicted. During a read operation, a second voltage may be used which is substantially less than the first voltage. For example, as second voltage may be about 50 mV to about 250 mV. The resulting change of resistance of the channel 125 may be measured based on the flow of current between the bottom electrode 110 and the top electrode 150. It should be noted that voltage for measurement may be substantially less than the write conditions, such that the movement of ions described with respect to FIG. 7 does not occur.

Figure 9:
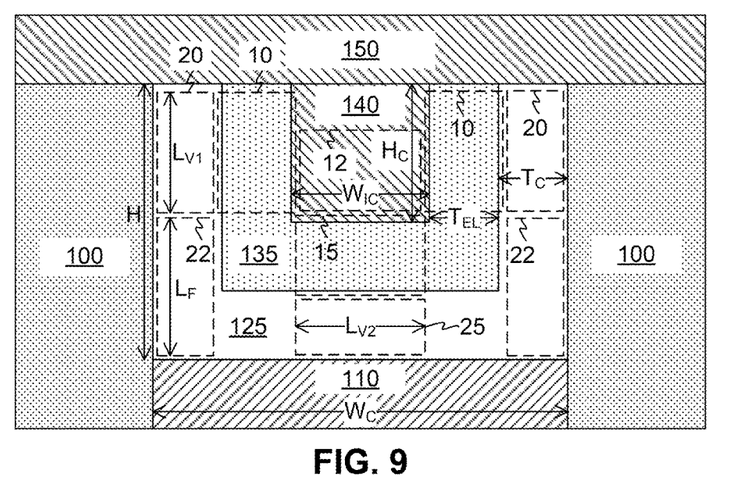
FIG. 9 depicts possible tuning parameters of the device design, according to an example embodiment.

Referring to FIG. 9, tuning parameters of the memory cell are depicted with associated electrical structures overlaid on the cell. In tuning of the cell, realization of more ion mobility through the programming gate 10, and less through the programming gate 15, may enable more precise control of the dynamic range of resistances through the variable resistor 20. Ion flow through programming gate 10 may be tuned using fixed channel resistor 22 and fixed inner resistor 12. The resistance through the fixed channel resistor 22 may be based on the cell height H, the height of the core $H_C$, and the thickness of the ion exchange layer $T_{EL}$. The resistance through the fixed inner resistor 12 may be based on the height of the core $H_C$ and the width $W_{IC}$ of the conductive core 140.

The capacitance of the programming gate 10 may be dependent on the material, the thickness of the ion exchange layer $T_{EL}$ and the area of the capacitive element, which may be related to the length of the variable resistors $L_{V1}$ and $L_{V2}$. The capacitance, and structure, of the programming gate 10 and 15 may impact the rate of ion mobility into the variable resistor 20 and 25 during write operations, as well as the voltage across the programming gate 10 required to perform write operations.

The resistance of the variable resistor 20 is dependent on the fixed parameters of the material, length $L_{V1}$ or $L_{V2}$ and thickness $T_C$ of the channel layer 125, as well as a dynamic concentration of mobile ions from the ion exchange layer 135. The length of the variable resistor 20, $L_{V1}$ or $L_{V2}$, may be dependent on the height H of the cell, thickness $T_C$ of the channel layer 125, and thickness of the ion exchange layer $T_{EL}$. The dynamic concentration is based on programming of the unit cell, as depicted in FIG. 10.

The electrical parameters may be tuned according to the principles set forth above. Additionally, in some embodiments, variations in geometry may be used as well (e.g., change contact angle between the read channel and the bottom electrode).

Referring to FIG. 10, the memory cell of FIG. 5 is depicted as part of a cross-point array, as may be used in analog computing. In this embodiment, the top electrode 150 may be a part of a word line 150A/B/C, while the bottom electrode 110 may be a part of a bit line 110 AB/C. Each junction of a word line 150A/B/C and bit line 110A/B/C may include a memory cell as depicted in FIG. 5.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A memory structure comprising:
   a first electrode;
   a multi-layer nonvolatile electrochemical cell, wherein a center of the multi-layer nonvolatile electrochemical cell comprises a conductive core laterally surrounded by a programming gate, wherein the conductive core is in contact with the first electrode, and wherein programming gate is laterally surrounded by a channel; and a second electrode is in contact with the channel.

2. The structure of claim 1, wherein the first electrode is in contact with the channel.

3. The structure of claim 1, wherein the programming gate comprises an ion exchange layer.

4. The structure of claim 3, wherein a material of the ion exchange layer comprises a metal oxide.

5. The structure of claim 4, wherein the ion exchange layer comprises a metal-oxide reservoir.

6. The structure of claim 3, wherein the first electrode is in contact with the channel, the ion exchange layer, and the conductive core.

7. The structure of claim 6, wherein the ion exchange layer and the conductive core have a cross-sectional U-shape.

8. The structure of claim 6, wherein the ion exchange layer has a substantially uniform first thickness, and wherein the channel has a substantially uniform second thickness.

9. A method of writing to a memory structure comprising:
creating a voltage between a first electrode and a second electrode of a multi-layer nonvolatile electrochemical cell;
wherein the voltage cause electrons to move through a variable resistance channel of the multi-layer nonvolatile electrochemical cell;
causes an electric field across a charge-exchange layer thereby causing ions to move along that electric field in in the multi-layer nonvolatile electrochemical cell; and
wherein the direction of movement of ions is different from the direction of movement of electrons, and
wherein the variable resistance channel extends from the first electrode to the second electrode.

10. The method of claim 9, wherein the charge exchange layer comprises a metal oxide layer located in contact with the variable resistance channel.

11. The method of claim 9, wherein an ion exchange layer of the multi-layer nonvolatile electrochemical cell includes a metal containing reservoir layer.

12. A memory structure comprising:
a first electrode;
a multi-layer nonvolatile electrochemical cell, wherein a center of the multi-layer nonvolatile electrochemical cell comprises a conductive core laterally surrounded by a programming gate, wherein the conductive core is in contact with the first electrode, and wherein programming gate is laterally surrounded by a channel; and
a second electrode is in contact with the channel,
wherein read and write operations pass between the first electrode and the second electrode through the multi-layer nonvolatile electrochemical cell, and wherein a path of the read operation and a path of the write operation are different.

13. The structure of claim 12, wherein the multi-layer nonvolatile electrochemical cell includes an ion exchange layer.

14. The structure of claim 13, wherein a material of the ion exchange layer comprises a metal oxide.

15. The structure of claim 14, wherein the oxide is selected from a group consisting of: HfOx and TaOx.

16. The structure of claim 12, wherein the first electrode is in contact with the channel.

17. The structure of claim 12, wherein a material for the channel is selected from a group consisting of: WOx, TiOx, VOx, TaOx.

18. The structure of claim 12, wherein the first electrode is in contact with the channel and the conductive core.

* * * * *